United States Patent [19]

Gregersen et al.

[11] 4,194,151

[45] Mar. 18, 1980

[54] MULTIFREQUENCY GENERATOR

[75] Inventors: Jens O. Gregersen, Karlslunde; Sigurd B. Sørensen, Taastrup, both of Denmark

[73] Assignee: General Electric Company, Lynchburg, Va.

[21] Appl. No.: 920,372

[22] Filed: Jun. 29, 1978

[51] Int. Cl.$^2$ .............................................. H03B 3/08
[52] U.S. Cl. ............................................. 455/76; 331/2; 455/87; 455/183
[58] Field of Search ................... 325/17, 18, 19, 20, 325/184, 146, 148, 418, 419, 421; 331/1 R, 2, 18, 22, 30, 31, 41, 47, 50, 51, 55, 64

[56] References Cited

U.S. PATENT DOCUMENTS

| 3,409,836 | 11/1968 | Wallett | 325/421 |
| 3,416,096 | 12/1968 | Kim | 331/2 |
| 3,895,311 | 7/1975 | Basse et al. | 331/2 |
| 4,097,816 | 6/1978 | Imazeki et al. | 331/2 |
| 4,114,110 | 9/1978 | Nossen | 331/2 |

OTHER PUBLICATIONS

"Frequency Synthesizers Theory & Design", pp. 28-37 ©1976, Wiley-Interscience-John Wiley & Sons, New York.

*Primary Examiner*—Benedict V. Safourek
*Attorney, Agent, or Firm*—James J. Williams

[57] ABSTRACT

A multifrequency generator is provided for a radio transmitter and receiver that must operate on a plurality of channels. The generator includes a channel synthesizer having a phase-locked loop that provides a respective output frequency signal for each selected channel. The generator includes a transmitter synthesizer connected to the channel synthesizer and having a phase-locked loop and a mixer that provide the transmitter synthesizer output signal. The generator includes a receiver synthesizer connected to the channel synthesizer and having a phase-locked loop and a mixer that provide the receiver synthesizer output signal. The frequency of the channel synthesizer output frequency is selected to be substantially lower than the transmitter and receiver synthesizer output frequencies to reduce the noise sideband components of the transmitter and receiver output signals.

15 Claims, 2 Drawing Figures

| CHANNEL NO. | CHANNEL SYNTHESIZER 10 | | | TRANSMITTER SYNTHESIZER 20 | | | RECEIVER SYNTHESIZER 30 | | | RECEIVER FREQ. |
|---|---|---|---|---|---|---|---|---|---|---|
| | OSC. 11 FREQ. | DIVIDER NO. | OSC. 15 FREQ. | OSC. 21 FREQ. | MIXER 22 FREQ. | OSC. 26 FREQ. | OSC. 31 FREQ. | MIXER 32 FREQ. | OSC. 36 FREQ. | |
| 1 | .015 | 833 | 12.495 | 145.275 | 12.495 | 157.770 | 128.815 | 12.495 | 141.310 | 152.510 |
| 2 | .015 | 834 | 12.510 | 145.275 | 12.510 | 157.785 | 128.815 | 12.510 | 141.325 | 152.525 |
| 3 | .015 | 835 | 12.525 | 145.275 | 12.525 | 157.800 | 128.815 | 12.525 | 141.340 | 152.540 |
| 4 | .015 | 836 | 12.540 | 145.275 | 12.540 | 157.815 | 128.815 | 12.540 | 141.355 | 152.555 |
| 5 | .015 | 837 | 12.555 | 145.275 | 12.555 | 157.830 | 128.815 | 12.555 | 141.370 | 152.570 |
| 6 | .015 | 838 | 12.570 | 145.275 | 12.570 | 157.845 | 128.815 | 12.570 | 141.385 | 152.585 |
| 7 | .015 | 839 | 12.585 | 145.275 | 12.585 | 157.860 | 128.815 | 12.585 | 141.400 | 152.600 |
| 8 | .015 | 840 | 12.600 | 145.275 | 12.600 | 157.875 | 128.815 | 12.600 | 141.415 | 152.615 |
| 9 | .015 | 841 | 12.615 | 145.275 | 12.615 | 157.890 | 128.815 | 12.615 | 141.430 | 152.630 |
| 10 | .015 | 842 | 12.630 | 145.275 | 12.630 | 157.905 | 128.815 | 12.630 | 141.445 | 152.645 |
| 11 | .015 | 843 | 12.645 | 145.275 | 12.645 | 157.920 | 128.815 | 12.645 | 141.460 | 152.660 |
| 12 | .015 | 844 | 12.660 | 145.275 | 12.660 | 157.935 | 128.815 | 12.660 | 141.475 | 152.675 |
| 13 | .015 | 845 | 12.675 | 145.275 | 12.675 | 157.950 | 128.815 | 12.675 | 141.490 | 152.690 |
| 14 | .015 | 846 | 12.690 | 145.275 | 12.690 | 157.965 | 128.815 | 12.690 | 141.505 | 152.705 |
| 15 | .015 | 847 | 12.705 | 145.275 | 12.705 | 157.980 | 128.815 | 12.705 | 141.520 | 152.720 |
| 16 | .015 | 848 | 12.720 | 145.275 | 12.720 | 157.995 | 128.815 | 12.720 | 141.535 | 152.735 |
| 17 | .015 | 849 | 12.735 | 145.275 | 12.735 | 158.010 | 128.815 | 12.735 | 141.550 | 152.750 |
| 18 | .015 | 850 | 12.750 | 145.275 | 12.750 | 158.025 | 128.815 | 12.750 | 141.565 | 152.765 |
| 19 | .015 | 851 | 12.765 | 145.275 | 12.765 | 158.040 | 128.815 | 12.765 | 141.580 | 152.780 |
| 20 | .015 | 852 | 12.780 | 145.275 | 12.780 | 158.055 | 128.815 | 12.780 | 141.595 | 152.795 |

FIG. 2

MULTIFREQUENCY GENERATOR

BACKGROUND OF THE INVENTION

Our invention relates to an improved multifrequency generator, and particularly to such a generator for supplying one of a plurality of selectable frequencies with minimum noise sideband components to a radio transmitter and a radio receiver.

In two-way radio communication, it is desirable for a radio transmitter and radio receiver (sometimes called a transceiver) to transmit and receive on a plurality of different radio frequency channels. This is particularly true where, in a given geographical area, there are a plurality of such channels available to a user. In such an area, a user can avail himself of one of these channels by switching his radio equipment until an idle channel is found, or by having equipment that automatically switches his radio equipment to an idle channel.

Accordingly, a primary object of our invention is to provide a new and improved multifrequency generator for a radio transmitter and/or a radio receiver.

Another object of our invention is to provide a new and improved multifrequency generator that can be readily shifted to a desired frequency in a group or band of frequencies.

In two-way radio communication, duplex operation is often desired so that a user can transmit and receive at the same time, as in a normal conversation. This duplex operation usually requires two different frequencies, one for transmitting and one for receiving.

Accordingly, another object of our invention is to provide a new and improved multifrequency generator that can selectively produce two different frequencies with minimum noise component content in a group or band of frequencies.

Another object of our invention is to provide a new and improved multifrequency generator that has a single control that enables the generator to produce a selected transmitting frequency and a selected receiving frequency from a group or band of frequencies.

In today's radio systems, frequency stability must meet all legal requirements. Such stability can usually only be achieved by the use of piezoelectric crystal oscillators. If the number of selectable frequencies is relatively high, a separate crystal for each frequency for the radio transmitter and a separate crystal for each frequency for the radio receiver is economically undesirable or impractical.

Accordingly, another object of our invention is to provide a new and improved multifrequency generator that requires relatively few crystal oscillators.

Another object of our invention is to provide a new and improved multifrequency generator that requires one relatively low frequency oscillator for all channel frequency signals, a second crystal oscillator which may be modulated for all transmitter frequency signals, and a third crystal oscillator for all receiver frequency signals if different from the transmitter frequencies.

SUMMARY OF THE INVENTION

Briefly, these and other objects are achieved in accordance with our invention by a multifrequency generator having a channel synthesizer, a transmitter synthesizer, and a receiver synthesizer. The channel synthesizer comprises a reference oscillator and a voltage-controlled oscillator connected in a phase-locked loop to provide a selectable chanel frequency. The channel frequency is applied to the transmitter synthesizer which comprises a modulated reference oscillator, a voltage-controlled oscillator, and a mixer connected in a phase-locked loop. The transmitter synthesizer output frequency is mixed with the reference frequency, and the difference between the two mixed frequencies and the selected channel frequency are used to control the transmitter synthesizer output frequency. For a separate receiver frequency, the channel frequency is applied to the receiver synthesizer which comprises a reference oscillator, a voltage-controlled oscillator, and a mixer connected in a phase-locked loop. The receiver synthesizer output frequency is mixed with the reference frequency, and the difference between the two mixed frequencies and the selected channel frequency are used to control the receiver synthesizer output frequency. Thus, a plurality of selectable frequency signals can be provided with a minimum or relatively small number of reference frequency oscillators.

BRIEF DESCRIPTION OF THE DRAWING

The subject matter which we regard as our invention is particularly pointed out and distinctly claimed in the claims. The structure and operation of our invention, together with further objects and advantages, may be better understood from the following description given in connection with the accompanying drawing, in which:

FIG. 2 shows a table for explaining the design and operation of our multifrequency generator.

DESCRIPTION OF THE PREFERRED EMBODIMENT

Figure 1:
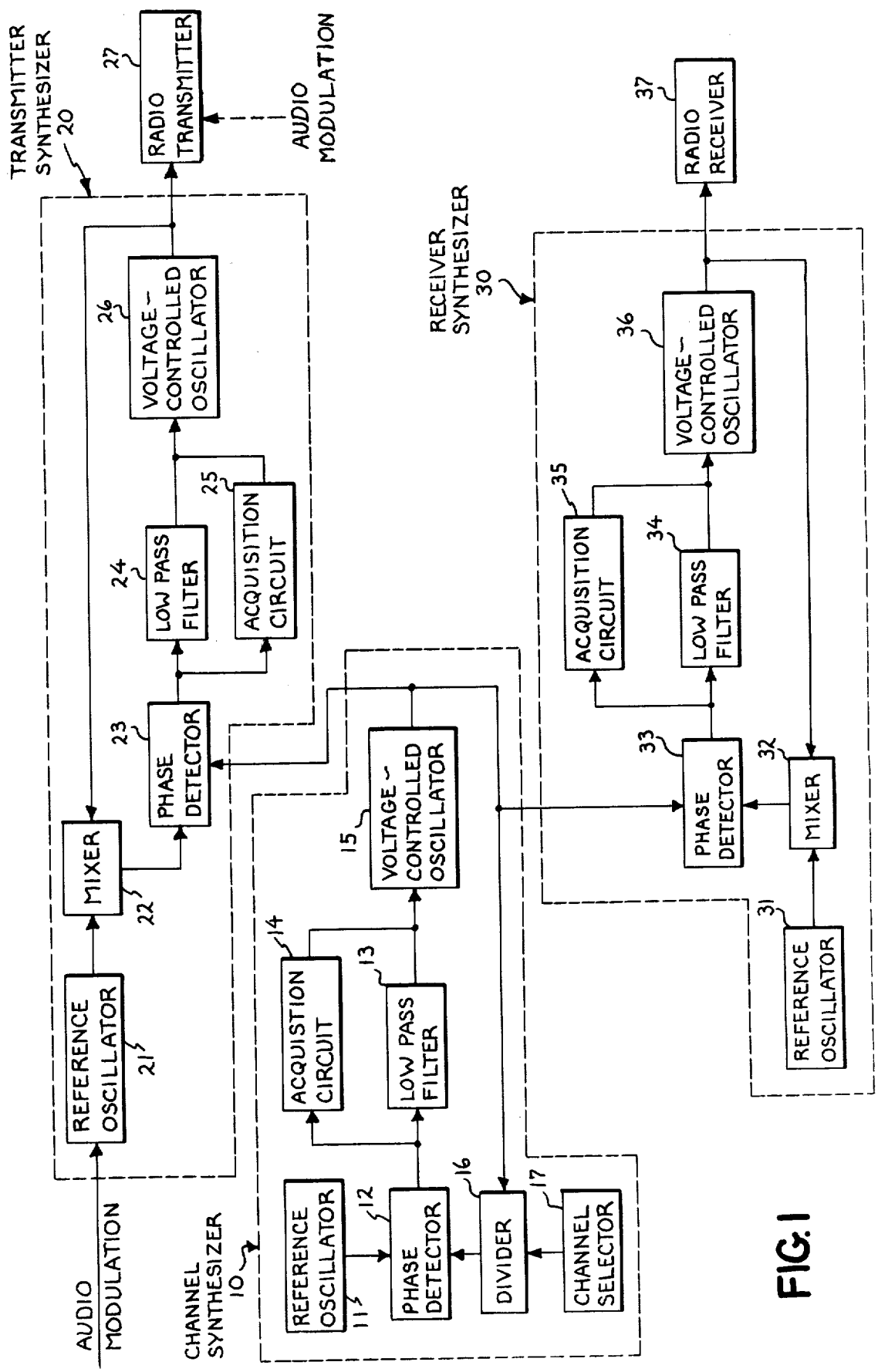
FIG. 1 shows a block diagram of a preferred embodiment of a multifrequency generator in accordance with our invention.

In this description, we will first describe the arrangement of our generator, and we will then describe how our generator can be designed and operated.

Generator Arrangement

To illustrate a preferred use for our multifrequency generator, we have assumed (by way of example only) that our generator provides a plurality of frequencies or channels for a radio transmitter and a radio receiver. We have also assumed that the transmitter and receiver are capable of full duplex operation, so that a separate transmitting frequency and a separate receiving frequency are needed for each selected channel. As shown in FIG. 1, our multifrequency generator comprises a channel synthesizer 10, a transmitter synthesizer 20, and a receiver synthesizer 30, each of which is respectively enclosed by dashed lines.

The channel synthesizer 10 comprises a reference oscillator 11 which is preferably of the crystal-controlled type. The output from the oscillator 11 is applied to one input of a phase detector 12. The output of the phase detector 12 is applied to a low pass filter 13 and to an acquisition circuit 14. The outputs of the filter 13 and the acquisition circuit 14 are applied to a voltage-controlled oscillator 15. The output of the oscillator 15 is applied to the transmitter synthesizer 20 and to the receiver synthesizer 30. In the channel synthesizer 10, the output of the oscillator 15 is applied to a frequency changer in the form of a divider circuit 16. The circuit 16 divides the frequency of the signals from the oscillator 15 by some number, preferably an integer, determined by a channel selector 17. The divided output from the divider circuit 16 is applied to the other input of the phase detector 12.

The channel synthesizer 10 as described is sometimes referred to as a phase-locked loop. The phase of the signals from the reference oscillator 11 and the phase of signals from the divider 16 are compared in the phase detector 12 which produces a voltage whose polarity and magnitude are indicative of the relative phase of the two signals. This voltage is applied through the filter 13 to the voltage-controlled oscillator 15 to cause the oscillator 15 to produce signals whose phase and frequency, when divided, have the same phase relation and frequency as the signals from the oscillator 11. If the frequency of the signals from the oscillator 15 varies from the proper frequency an excessive amount, the acquisition circuit 14 causes the oscillator 15 to pull in or produce a frequency which, when divided by the divider 16, approaches the frequency of the reference oscillator 11. Once the pull-in is achieved, the acquisition circuit 14 no longer provides an output, and the low pass filter 13 continues to supply the voltage needed to cause the oscillator 15 to produce the proper phase and frequency. This frequency is N times the frequency of the reference oscillator 11, where N is the dividing number supplied by the channel selector 17 to the divider 16. To achieve phase lock, the oscillator 15 must produce a frequency which is N times the reference oscillator signal frequency. If the divider 16 is replaced by a multiplier, then to achieve phase lock, the frequency of the oscillator 15 would have to be 1/N times the frequency of the oscillator 11, where N is the multiplying number supplied by the channel selector 17. Thus, the divider 16 (or multiplier if used) acts as a frequency changer.

In the transmitter synthesizer 20, a crystal controlled or stable reference oscillator 21 supplies signals to a mixer 22. Since the synthesizer 20 is intended to provide signals to a radio transmitter circuit 27, we have shown the reference oscillator 21 provided with an audio modulation signal which causes the frequency (or phase depending upon the specific modulating circuit used) of the oscillator 21 to vary in accordance with that modulation. The oscillator signals are applied to one input of a mixer circuit 22. The output of the mixer circuit 22 is applied to one input of a phase detector 23. The other input of the detector 23 is connected to the output of the oscillator 15 of the channel synthesizer 10. The output of the phase detector 23 is applied to a low pass filter 24 and to an acquisition circuit 25. The outputs of the filter 24 and the acquisition circuit 25 are applied to a voltage-controlled oscillator 26. The output of the oscillator 26 is applied to the transmitter 27 which is provided with an amplifier or frequency multiplier if needed. And, the transmitter 27 is further provided with a modulator if modulation is provided at the output of the oscillator 26 rather than at the input of the oscillator 21. If modulation is provided at the input of the oscillator 21, the output of the oscillator 26 carries the intelligence or information provided by the modulation applied to the reference oscillator 21. The output of the oscillator 26 is also applied to the other input of the mixer 22.

The synthesizer 20 is sometimes referred to as a phase-locked loop with a mixer circuit. The mixer 22 is intended to produce an output that represents the difference between the signals from the oscillator 21 and the oscillator 26. These difference frequency signals are compared in the phase detector 23 with the signals from the oscillator 15 of the channel synthesizer 10. The phase detector 23 produces a voltage whose polarity and magnitude represent the relative phase of the two signals. The output voltage of the phase detector 23 is applied to the acquisition circuit 25 to cause the oscillator 26 to pull in if the frequency deviation is excessive, after which the acquisition circuit 25 relinquishes control and the filter 24 controls the phase and frequency of the oscillator 26.

The receiver synthesizer 30 is similar to the transmitter synthesizer 20, except that the reference oscillator 31 is a fixed frequency oscillator, since no modulating signal is needed. In our assumed example, the receiver synthesizer 30 provides a signal for use in the mixer circuit of a radio receiver 37. In that receiver 37, received radio frequency signals are mixed in the mixer with the signals from the synthesizer 30 to produce a suitable intermediate frequency for amplification and subsequent demodulation. However, the exact frequency supplied by the synthesizer 30 may be varied depending upon the particular application.

One of the problems of wideband high frequency synthesizers has been the undesirable noise components which appear in the transmitter and receiver local oscillator signals because of the relatively low Q (or large bandwidth) of a voltage-controlled oscillator. As the center frequency of such an oscillator is increased, its loaded bandwidth is also increased. This increased loaded bandwidth results in higher sideband noise levels. To improve the quality of the transmitter and receiver local oscillator frequencies provided by the oscillators 26, 36, we have designed the phase-locked loop of the synthesizer 10 so that its loaded bandwidth is relatively small and so that output frequency applied to the detectors 23, 33 is substantially lower than the frequency of output signals from the oscillators 26, 36. As an example, the bandwidth of the oscillator 15 could be 120 KHz, and the frequency of the oscillator 15 can be one-tenth (or one-twentieth or less) of the frequency of the oscillators 26, 36. The noise reduction which can be obtained is a function of the loaded bandwidth at the operating frequency of the oscillator 15. That is, if the oscillator 15 is operated with a low loaded bandwidth, this low loaded bandwidth serves as the basis for correcting the frequency (and hence noise) of the oscillators 26, 36 on a direct numerical basis (i.e. cycle to cycle) rather than on a percentage of center frequency basis. Because of this cycle to cycle correction, the sideband noise in the oscillators 26, 36 is reduced considerably. For example, if the bandwidth of the oscillator 15 is 120 KHz and its center frequency is 12 MHz, and this frequency is converted to 144 MHz by the synthesizer 20 as will be explained, the loaded bandwidth of the synthesizer 20 is effectively only 120 KHz. This results in a high quality, low noise signal for use by the transmitter 27 and receiver 37.

Generator Design and Operation

To further illustrate our invention, we have assumed that the multifrequency generator of FIG. 1 must supply a separate transmitter frequency and a separate receiver frequency for each of 20 radio channels. The lowest receiver frequency is to be 152.510 megahertz, and the companion transmitter frequency is to be 157.770. The 20 chanels are to be spaced 0.015 megahertz, so that the highest receiver frequency is 152.510 plus 19 times 0.015 or 152.795 megahertz; and the highest transmitter frequency is 157.770 plus 19 times 0.015 or 158.055 megahertz. We have found that a good output frequency of our channel synthesizer 10 for application to the transmitter and receiver synthesizers 20, 30 is in the order of 12 megahertz. Since the channel spacings are 0.015 megahertz, this means that the synthesizer 10 must multiply the frequencies of the oscillator 11 by a number in the order of 12 divided by 0.015, which is 800. Accordingly, we selected a multiplier of 833 and upward. Actually, this means that the channel selector 17 must cause the divider 16 to divide the frequency from the oscillator 15 by a number starting with 833 and increasing upward by integral amounts.

For the lowest channel, the synthesizer 10 produces a signal whose frequency is 833 times 0.015 megahertz, or 12.495 megahertz. The lowest transmitter frequency is 157.770, so that the reference oscillator 21 is set to produce a frequency of 157.770 minus 12.495, or 145.275 megahertz. Actually, of course, this frequency is shifted slightly above and below the set frequency by the amount of the audio modulation or other intelligence. With the transmitter voltage-controlled oscillator 26 producing the desired output frequency of 157.770 megahertz, this signal is mixed in the mixer 22 with the signal of 145.275 megahertz from the oscillator 21. The mixer circuit 22 produces a difference frequency of 12.495 megahertz whose phase is compared in the detector 23 with the channel synthesizer frequency of 12.495 megahertz to control the phase frequency of the oscillator 26.

The selection of frequencies for the receiver synthesizer 30 is made in a similar manner. However, the lowest receiver frequency is 152.510 megahertz, and we have assumed that an intermediate frequency of 11.2 megahertz is needed in the receiver. Hence, the receiver synthesizer 30 should produce a lowest frequency of 152.510 minus 11.2 megahertz, or 141.310 megahertz. When the output from the channel synthesizer 10 is set to supply a frequency of 12.495, the oscillator 31 in the receiver synthesizer 30 is set to produce a frequency of 141.310 minus 12.495 megahertz, or 128.815 megahertz.

In order to increase the frequency for the transmitter and receiver for each channel, the divider 16 in the synthesizer 10 can be increased by a suitable integral number to cause the synthesizer 10 to produce a signal whose frequency is needed for the particular channel selected. This is illustrated by the table shown in FIG. 2. In FIG. 2, the first (leftmost) vertical column gives the channel number from 1 to 20. The next three vertical columns under channel synthesizer 10 give the frequency in megahertz of the reference oscillator 11, the number by which the output of the oscillator 15 is divided, and the output frequency in megahertz of the voltage-controlled oscillator 15. The next three vertical columns under transmitter synthesizer 20 give the basic frequency in megahertz of the reference oscillator 21, the frequency in megahertz produced by the mixer circuit 22, and the output frequency in megahertz of the voltage-controlled oscillator 26. The next three vertical columns under receiver synthesizer 30 give the frequency in megahertz of the reference oscillator 31, the frequency in megahertz of the mixer circuit 32, and the output frequency in megahertz of the voltage-controlled oscillator 36. The last (rightmost) vertical column gives the assumed receiver frequency for each of the 20 channels, and it will be noted that this frequency is 11.2 megahertz greater than the output frequency of the oscillator 36.

While FIG. 2 shows only 20 channels, each with a respective transmitter frequency and a respective receiver frequency, our multifrequency generator is capable of producing more frequencies, the number being limited only by the frequency range of the voltage-controlled oscillators 15, 26, 36. These frequencies are determined by highly stable, crystal control oscillators 11, 21, 31. Thus, our circuit provides a large number of easily selected transmitting and receiving frequencies with only three oscillators. The frequencies are easily selected by operation of the channel selector 17. The selector 17 may be a manual device or may be automatically programmed by some other control or circuit to cause the divider 16 to divide by the appropriate integer or number to produce the desired frequencies.

CONCLUSION

It will be seen that our multifrequency generator is an improved and versatile arrangement that can be used in many applications. Our generator requires only one stable oscillator for the channel synthesizer frequencies, and one stable oscillator for each output frequency synthesizer. The output synthesizers provide excellent filtering of any harmonics which may be present in or produced by the channel synthesizer, so that their output signals are relatively free of spurious signals. And because of the small loaded bandwidth of the oscillator 15, the output signals from the oscillators 26, 36 have low noise content and high quality. While we have shown only one embodiment of our invention, persons skilled in the art will appreciate the modifications which can be made based upon the block diagram of FIG. 1. More output synthesizers (each with its respective frequencies) can be used with the channel synthesizer, or only one output synthesizer can be used. The various blocks may take a number of forms or circuits, depending upon design preference. Similarly, our circuit is capable of operating at almost any desired frequency. The frequencies given in the above explanation and in FIG. 2 are examples only, and are not to be construed as limitations. It should be noted that the mixer 22 in the transmitter synthesizer 20 and the mixer 32 in the receiver synthesizer 30 will operate whether their respective reference oscillators 21, 31 produce higher or lower (as illustrated) frequencies than their respective voltage-controlled oscillators 26, 36. In the examples given above, the reference oscillator 21 had a frequency lower than the voltage-controlled oscillator 26, and the reference oscillator 31 had a frequency also lower than the voltage-controlled oscillator 36. The output frequency from the receiver synthesizer 30 may be higher than the radio frequency to be received. These relative frequencies could be changed, and the respective mixer would still produce the proper difference frequency. In order to make sure that the voltage-controlled oscillators 26, 36 operate at the desired frequency with respect to their respective reference frequencies, certain limiting circuits can be used. These limiting circuits can be included in the acquisition circuits 25, 35 to make sure that the oscillators 26, 36 operate at the proper frequency (either above or below) relative to the frequencies of the reference oscillators 21, 31. Or, the voltage-controlled oscillators 26, 36 can be constructed so that they can operate over only one frequency range, either above the reference oscillator frequency or below the reference oscillator frequency. Amplitude modulation can also be used with our circuit. If amplitude modulation is desired, the audio modulation would not be applied to the reference oscillator 21, but would be applied to a circuit following the output of the voltage-controlled oscillator 26. Frequency modulation can also be provided at the output of the oscillator 26 in place of the modulation at the input of the oscillator 21. And finally, our multifrequency generator can be used in other applications, such as a transmitter only or a receiver only, or in some other circuit where a wide range of selectable frequencies are needed. Therefore, while our invention has been described with reference to a particular embodiment, it is to be understood that modifications may be made without departing from the spirit of the invention or from the scope of the claims.

What we claim as new and desire to secure by Letters Patent of the United States is:

1. An improved system for generating a plurality of selectable transmitter and receiver frequencies comprising:
   a. a first phase-locked loop having a first reference oscillator, a phase detector having an input connected to said first reference oscillator, and a first controlled oscillator and frequency divider circuit connected between the output of said phase detector and an input of said phase detector for generating a relatively small bandwidth first signal whose frequency is determined by said reference oscillator and said frequency divider;
   b. a second phase-locked loop having a second reference oscillator, a mixer having an input connected to said second reference oscillator, a phase detector having an input connected to said mixer and having an input connected to said first controlled oscillator, and a second controlled oscillator connected between the output of said phase detector and an input of said mixer for generating a second signal whose frequency is determined by the frequency of said first signal and the frequency of said second reference oscillator;
   c. and a third phase-locked loop having a third reference oscillator, a mixer having an input connected to said third reference oscillator, a phase detector having an input connected to said mixer and having an input connected to said first controlled oscillator, and a third controlled oscillator connected between the output of said phase detector and an input of said mixer for generating a third signal whose frequency is determined by said frequency of said first signal and the frequency of said third reference oscillator.

2. The improved synthesizer of claim 1 wherein each of said mixers provides a signal at its output representing a difference in frequency of signals applied to its inputs.

3. The improved synthesizer of claim 1 wherein said second reference oscillator frequency differs from said third reference oscillator frequency.

4. The improved synthesizer of claim 1 wherein said frequency divider circuit is varied by a channel selector.

5. The improved synthesizer of claim 1 wherein each of said mixers provides a signal at its output representing a difference in frequency of signals applied to its inputs, and wherein said second reference oscillator frequency differs from said third reference oscillator frequency.

6. The improved synthesizer of claim 1 wherein each of said mixers provides a signal at its output representing a difference in frequency of signals applied to its inputs, and wherein said frequency divider circuit is varied by a channel selector.

7. The improved synthesizer of claim 1 wherein said second reference oscillator frequency differs from said third reference oscillator frequency, and wherein said frequency divider circuit is varied by a channel selector.

8. The improved synthesizer of claim 1 wherein each of said mixers provides a signal at its output representing a difference in frequency of signals applied to its inputs, wherein said second reference oscillator frequency differs from said third reference oscillator frequency, and wherein said frequency divider circuit is varied by a channel selector.

9. A multifrequency generator comprising:
   a. a channel synthesizer comprising a phase-locked loop for selectively producing a plurality of relatively small bandwidth channel frequencies determined by a channel selector connected in said phase-locked loop;
   b. and a first output synthesizer comprising a phase-locked loop having a mixer, a controlled oscillator, and a phase detector, said phase detector being connected to said channel synthesizer, said first output synthesizer oscillator selectively producing a plurality of relatively wide bandwidth, low noise output frequencies determined by the respective channel frequency produced by said channel synthesizer.

10. The multifrequency generator of claim 9 and further comprising information modulation means connected to said first output synthesizer for causing said first output synthesizer output frequency to be modulated as a function of said information.

11. The multifrequency generator of claim 9 and further comprising a second output synthesizer comprising a phase-locked loop having a mixer, a controlled oscillator, and a phase detector, said phase detector being connected to said channel synthesizer, said second output synthesizer oscillator selectively producing a plurality of relatively wide bandwidth, low noise output frequencies determined by the respective channel frequency produced by said channel synthesizer.

12. The multifrequency generator of claim 11 and further comprising information modulation means connected to said first output synthesizer for causing said first output synthesizer output frequency to be modulated as a function of said information.

13. An improved multifrequency transceiver comprising:
   a. a radio transmitter comprising:
      1. an output circuit;
      2. a transmitter synthesizer comprising a reference oscillator, a mixer, a phase detector, and a voltage-controlled oscillator connected to provide a phase-locked loop to cause said voltage-controlled oscillator to produce a transmitter output frequency determined by the difference frequency produced by said transmitter mixer from said oscillators and applied to one input of said transmitter phase detector, and by a channel frequency applied to a second input of said transmitter phase detector;
      3. and means connecting the output of said transmitter voltage-controlled oscillator to said output circuit;
   b. a radio receiver comprising:
      1. a receiver mixer and demodulator circuit;
      2. a receiver synthesizer comprising a reference oscillator, a mixer, a phase detector, and a voltage-controlled oscillator connected to provide a phase-locked loop to cause said receiver voltage-controlled oscillator to produce a receiver mixer frequency determined by the difference frequency produced by said receiver mixer from said oscillators and applied to one input of said receiver phase detector, and by a channel frequency applied to a second input of said receiver phase detector;

3. and means connecting the output of said receiver voltage-controlled oscillator to said receiver mixer circuit;

c. and a channel synthesizer comprising:

1. a reference oscillator, a phase detector, a channel selection circuit, and a voltage-controlled oscillator connected to provide a phase-locked loop to cause said channel voltage-controlled oscillator to produce a relatively low bandwidth channel frequency determined by said phase detector from said reference oscillator and from said channel selection circuit and said voltage-controlled oscillator;

2. and means connecting the output of said channel voltage-controlled oscillator to said second input of said transmitter phase detector and to said second input of said receiver phase detector.

14. The improved multifrequency transceiver of claim 13 and further comprising means for applying a modulating signal to said transmitter reference oscillator.

15. The improved transceiver of claim 13 and further comprising means connected to said transmitter synthesizer to modulate the output of said transmitter voltage-controlled oscillator.

* * * * *